United States Patent
Martin et al.

(10) Patent No.: US 8,153,305 B2
(45) Date of Patent: Apr. 10, 2012

(54) ELECTROLYTIC ORGANIC GLASS, ITS MANUFACTURING PROCESS AND DEVICE COMPRISING IT

(75) Inventors: Steve Martin, Saint Sauveur (FR); Raphaël Salot, Lans-en-Vercors (FR); Pascal Faucherand, Sassenage (FR); Sami Oukassi, Bizerte (FR); Lucie Jodin, Nancy (FR)

(73) Assignees: Commissariat a l'Energie Atomique, Paris (FR); St Microelectronics SA, Montrouge (FR)

( * ) Notice: Subject to any disclaimer, the term of this patent is extended or adjusted under 35 U.S.C. 154(b) by 1008 days.

(21) Appl. No.: 12/116,585

(22) Filed: May 7, 2008

(65) Prior Publication Data
US 2008/0305399 A1 Dec. 11, 2008

(30) Foreign Application Priority Data
May 25, 2007 (FR) .................................. 07 03723

(51) Int. Cl.
*H01M 6/18* (2006.01)
(52) U.S. Cl. .... 429/306; 429/307; 252/62.2; 252/518.1; 252/521.3; 359/265; 359/270; 359/273

(58) Field of Classification Search ................... 429/306, 429/307; 252/62.2, 518.1, 521.3; 359/265, 359/270, 273
See application file for complete search history.

(56) References Cited

FOREIGN PATENT DOCUMENTS
FR 2 536 740 A 6/1984
FR 2 601 017 A 1/1988
WO WO 2006/059794 6/2006

OTHER PUBLICATIONS

Search Report for Corresponding Priority French Application No. 07/03723, filed May 25, 2007.
S. Zhao et al.: "Li-V-Si-O thin film electrolyte for all-solid-state Li-ion battery"; Journal of Power Sources, vol. 122, No. 2, Jul. 23, 2003; pp. 174-180; XP004437060.
Database Inspec [Online]; Database Accession No. 5542869; X. Yu et al.: "A stable thin-film lithium electrolyte: lithium phosphorus oxynitride"; Journal of the Electrochemical Society; vol. 144, No. 2, Feb. 1997; pp. 524-532; XP002459575.

*Primary Examiner* — Laura Weiner
(74) *Attorney, Agent, or Firm* — Alston & Bird LLP

(57) ABSTRACT

The invention relates to a solid electrolyte, to a process for its manufacture and also to devices comprising it.
The electrolyte of the invention is an amorphous solid of formula $Si_vO_wC_xH_yLi_z$, in which v, w, x, y and z are atomic percentages with $0 \leq v \leq 40$, $5 \leq w \leq 50$, $x>12$, $10 \leq y \leq 40$, $1 \leq z \leq 70$, and $95\% \leq v+w+x+y+z \leq 100\%$.
The electrolyte of the invention finds application in the field of electronics and microbatteries in particular.

7 Claims, 5 Drawing Sheets

ELECTROLYTIC ORGANIC GLASS, ITS MANUFACTURING PROCESS AND DEVICE COMPRISING IT

FIELD AND BACKGROUND OF THE INVENTION

The invention relates to a solid electrolyte, to a process for its manufacture and also to devices comprising it.

Lithium microbatteries are used in small-size electronic devices and also in semiconductor devices.

The electrolyte is a component that has a strong influence on the electrical performance of these microbatteries.

This is because the failures observed during cycling are often linked to an electrochemical degradation of the electrolyte in contact with lithium.

The performances of microbatteries are closely linked to the electrical properties of the electrolyte, such as the ionic and electronic conductivity.

These microbatteries are used in chip cards, smart labels, and supplying power to real-time clocks and microsystems.

All these applications force all the layers necessary for the operation of the battery to be, on the one hand, solid and, on the other hand, manufactured with techniques that are compatible with the industrial processes of microelectronics.

Among the solid electrolytes, two families can be distinguished: polymers and glasses.

In solid polymer electrolytes, a lithium salt is directly dissolved in the polymer matrix. The ionic conductivity is commonly attributed to the mobility of the $Li^+$ ions within the amorphous matrix of the solid polymer.

However, the solid polymer electrolytes have a low glass transition temperature, which generates the formation of crystalline zones capable of trapping the $Li^+$ ions and of inhibiting their mobility.

Furthermore, the method of producing polymer electrolytes does not make it possible to produce depositions that conform to the substrates, that is to say having the same thickness at all points of the substrate.

It is for these two reasons that the electrolyte commonly used today for producing a microbattery is a glass.

The term "glass" is understood to mean an amorphous material.

Among the glass described in the prior art, only inorganic glass such as LiPON (Lithium Phosphorus OxyNitride), LiSON (Lithium Sulphur OxyNitride) or LiSiPON (Lithium Silicon Phosphorus OxyNitride) are used as electrolytes.

In this family, LiPON is the solid electrolyte most used in current microbatteries as it has a good electrochemical stability with respect to lithium. However, it has a relatively low ionic conductivity, of around $2\times10^{-6}$ S/cm at ambient temperature, compared to that of certain polymer electrolytes.

Besides, organic glass such as amorphous carbon (a-$C_xH_y$) or PDMS-like materials ($SiO_xC_yH_z$) are commonly used in microelectronics. But in this case, they are used as insulators at the interconnections and not as an electrolytic organic glass.

SUMMARY OF THE INVENTION

To overcome the drawbacks of the solid electrolytes for lithium microbatteries of the prior art, the invention provides an electrolytic material, that is to say one that allows the conduction of the lithium ions, that can be deposited in a conformal manner, that is stable at ambient temperature and that has an ionic conductivity greater than $1\times10^{-6}$ S/cm.

For this purpose, the invention provides a solid amorphous electrolyte which is an organic glass of formula I below:

$$Si_vO_wC_xH_yLi_z \qquad \text{Formula I}$$

in which v, w, x, y and z are atomic percentages with
  $0 \leq v \leq 40$;
  $5 \leq w \leq 50$;
  $x > 12$;
  $10 \leq y \leq 40$;
  $1 \leq z \leq 70$; and
  $95\% \leq v+w+x+y+z \leq 100\%$.

The solid electrolyte of the invention is differentiated from the polymer electrolytes of the prior art in that it is not a polymer and it does not therefore have a glass transition temperature.

The electrolyte according to the invention is differentiated from electrolytes which are glasses of the prior art by its chemical composition: it contains carbon and therefore an organic phase.

Such solid amorphous materials of the organic glass type are not, a priori, favourable for obtaining good electrolytes insofar as the stability of the organic part towards lithium is not generally good.

However, it has now been discovered that the chemical stability of the electrolyte of the invention towards lithium was increased when the level of crosslinking of the solid electrolyte of the invention was increased, this level being characterized by the hardness level of the material.

However, the increase in the crosslinking, although increasing the stability of the electrolyte of the invention towards lithium, at the same time reduces its ionic conduction.

It is thought, without wishing to be bound by this theory, that the reduction of this ionic conduction is due to the increase of the density of the material.

But, it has also been discovered that the presence of the organic phase in the solid electrolyte of the invention enables a relaxation of the network that promotes ionic conduction.

Thus, when the solid electrolyte of the invention contains more than 12 at % of carbon, preferably between 20 and 40 at % of carbon, and has a hardness greater than or equal to 0.5 GPa, but less than 20 GPa, the amorphous solid electrolyte obtained is both chemically stable towards the lithium and has good ionic conduction properties.

The hardness of the solid electrolyte of the invention was measured by nanoindentation.

For this purpose, a CSM nanohardness measurement device was used in continuous multicycle mode, using a Berkovich indenter.

The tip of the indenter, placed on the surface whose hardness is to be measured, is forced into the sample by applying a load. The load is then decreased until the partial or complete relaxation of the material occurs. The load/depth curve is then used to calculate the mechanical properties such as hardness and elastic modulus.

Here, an initial load of 1 mN increased up to 10 mN was used to obtain an impression, left by the application of the load, of 100 to 200 nm. All the measurements were carried out on samples having a thickness of 2 μm.

More precisely, the electrolytic organic glass of the invention contains, in atomic percentages, more than 12% carbon, preferably between 20 and 40% carbon, between 1 and 70% lithium, preferably between 20 and 40% lithium, between 5 and 50% oxygen, preferably between 15 and 30% oxygen, and between 0 and 40% silicon, preferably between 0 and 15% silicon, and between 10 and 40% hydrogen, preferably between 15 and 30% hydrogen, the sum of the atomic percentages of carbon, lithium, oxygen, silicon and hydrogen being at least equal to 95%.

This is because, although the electrolytic organic glass of the invention may comprise only carbon, lithium, oxygen, silicon and hydrogen, it may also be anticipated to dope it by addition of materials such as fluorine, boron, phosphorus or nitrogen or mixtures thereof in order to give it a greater chemical resistance towards the atmosphere or an improved working cover.

Thus, the electrolyte of the invention may additionally comprise at most 5 at % of at least one dopant element.

The electrolyte of the invention is obtained by plasma-enhanced chemical vapour deposition of a gaseous carbon-based precursor, added to which are a gaseous lithiated precursor and a neutral carrier gas such as helium.

The carbon-based precursor makes it possible to obtain a glassy matrix of the a-$C_xH_y$ or $SiO_xC_yH_z$ type and may be hexamethyldisiloxane (HMDSO), tetraethyloxysilane (TEOS), octamethylcyclotetrasiloxane (OMCTSO), $C_7H_8$, $C_6H_{12}$, $CH_4$, $C_9H_{10}$, $C_2H_2$, tetrahydrofuran (THF) or a mixture of one or more of these carbon-based precursors.

The lithiated precursor, in order to functionalize the glassy matrix of the amorphous carbon or $SiO_xC_yH_z$ type, is preferably lithium hexamethyldisilazane (LiHMDS), lithium tetramethylheptanedionate (LiTMHD), lithium tert-butoxide (LiTBO), lithium acetylacetonate (LiAcac) or a mixture of one or more of these lithiated precursors.

The electrolyte of the invention meets the requirements of all-solid lithium microbatteries, the requirements of electrochromic systems and in general of any lithium accumulator.

Its manufacturing process is a process that is compatible with the processes used in microelectronics which makes it possible to carry out a deposition at low temperature, that is to say at a temperature below 300° C. and, in addition, the process makes it possible to control the deposited thicknesses of solid electrolyte to within a nanometer and this at deposition rates greater than 5 μm per hour.

The invention will be better understood and other details and advantages of it will appear more clearly on reading the explanatory description which follows and which is given with reference to the figures, in which:

DETAILED DESCRIPTION

Firstly, the process for manufacturing the electrolyte of the invention will be described with reference to FIG. 1.

Figure 1:
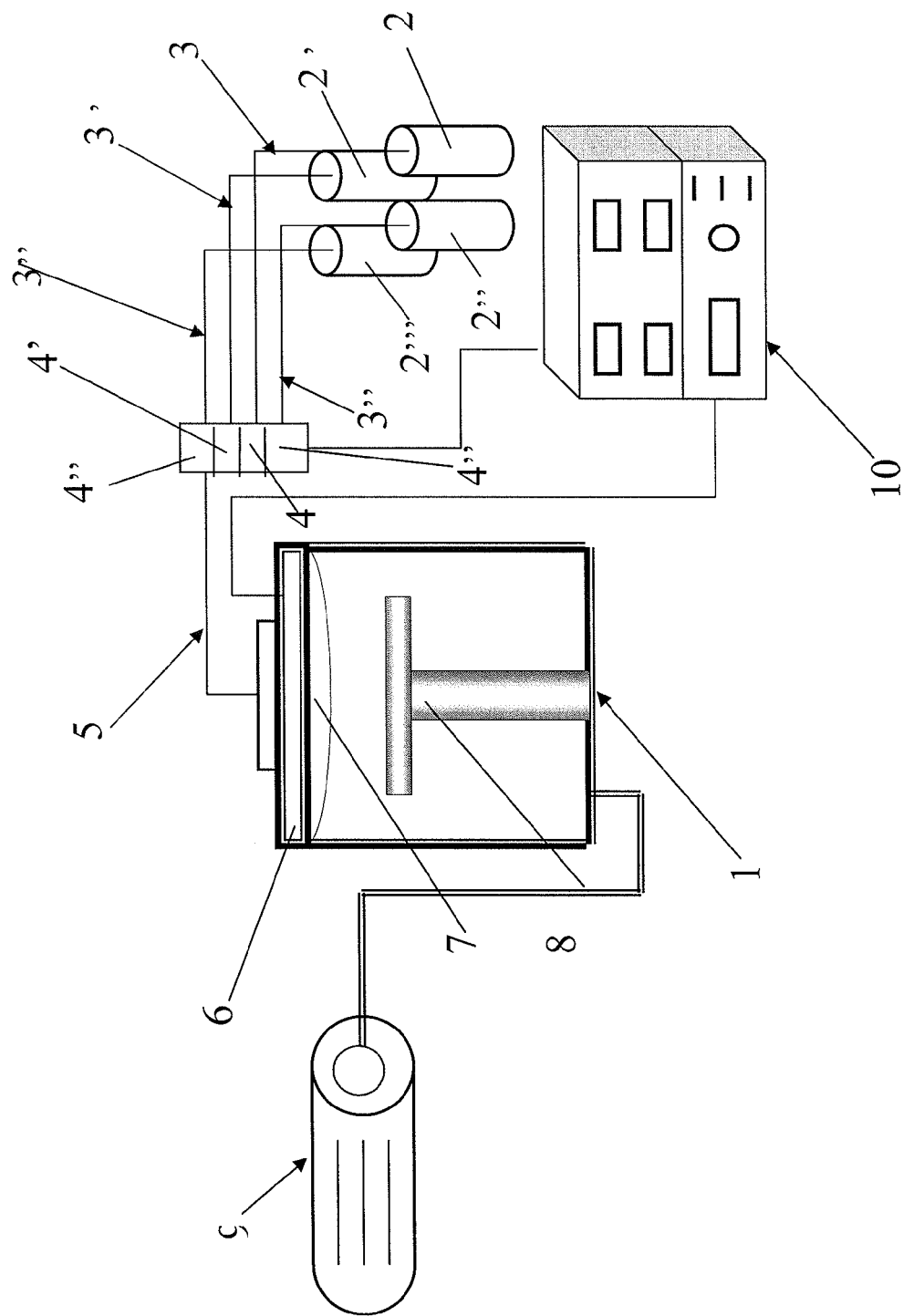
FIG. 1 schematically represents a device for plasma-enhanced chemical vapour deposition enabling the deposition and the manufacture of the electrolyte of the invention.

The gaseous lithiated precursor, the gaseous carbon-based precursor and the carrier gas and also the optional dopant element are each stored independently in one of the chambers denoted by 2, 2', 2" and 2''' in FIG. 1. They are conveyed via the ducts denoted by 3, 3', 3" and 3''' in FIG. 1 to flowmeters denoted by 4, 4', 4" and 4''' which make it possible to control the stoichiometry of the final compound to be obtained.

The gaseous mixture, containing the desired proportions of lithiated precursor, carbon-based precursor, optionally dopant elements and carrier gas is then conveyed via the duct, denoted by 5 in FIG. 1, into the plasma chamber, denoted by 1 in FIG. 1.

The gaseous mixture is injected via a shower type injection system, denoted by 6 in FIG. 1, into the plasma chamber 1. The plasma chamber 1 is kept at a pressure of 1 mbar by a vacuum pump, denoted by 9 in FIG. 1.

Next, the gaseous mixture is subjected to radiofrequency plasma, denoted by 7 in FIG. 1. The solid electrolyte of the invention of the desired chemical composition is then deposited to the desired thickness, onto the desired substrate (not shown) which is placed on a substrate holder, denoted by 8 in FIG. 1.

The pressure in the plasma chamber 1 and the power of the radiofrequency plasma are controlled using control devices, denoted by 10 in FIG. 1.

The use of a plasma as an energy carrier and activator of the chemical reactions enables a high decomposition of the precursors introduced into the chamber and this being in a random manner, which means that the material obtained cannot be described, as is the case for a polymer, by a generic formula of $[X]_n$ type where X represents a "base unit" carbon-based chain and n the distribution of this unit. Thus, long-range order is not retained. The material obtained is amorphous and glassy. The absence of a long polymer chain explains the absence of a glass transition temperature and of a recrystallization phenomena that is the cause of the instabilities generally observed in polymer electrolytes.

EXAMPLES

In order to better understand the invention, several embodiment examples will be described below, which are given solely by way of illustration and should not be considered as limiting the invention.

Example 1

Synthesis of a Solid Electrolyte of Formula SiOCHLi

By using the equipment shown in FIG. 1 and described above, a solid electrolyte of formula $C_{38}O_{21}H_{22}Li_{19}$ was obtained by injecting, into the plasma chamber, a gaseous mixture containing 500 sccm (standard $cm^3$ per min) of tetrahydrofuran (THF), 10 sccm of lithium tert-butoxide (LiTBO) and 200 sccm of helium.

The whole of the gaseous mixture was injected into the plasma chamber 1 and subjected to a plasma, denoted by 7, having a radiofrequency of 13.56 MHz with a power of 100 watts for 20 minutes.

Throughout the deposition, the overall pressure in the plasma chamber 1 was kept at 1 mbar.

The hardness of the obtained electrolyte was 2.3 GPa.

Example 2

Differential Scanning Calorimetry

The solid electrolyte of the invention obtained in Example 1 and also the most common polymer electrolyte in the prior art, which is polyethylene oxide (PEO), were analysed by differential scanning calorimetry.

Figure 2:
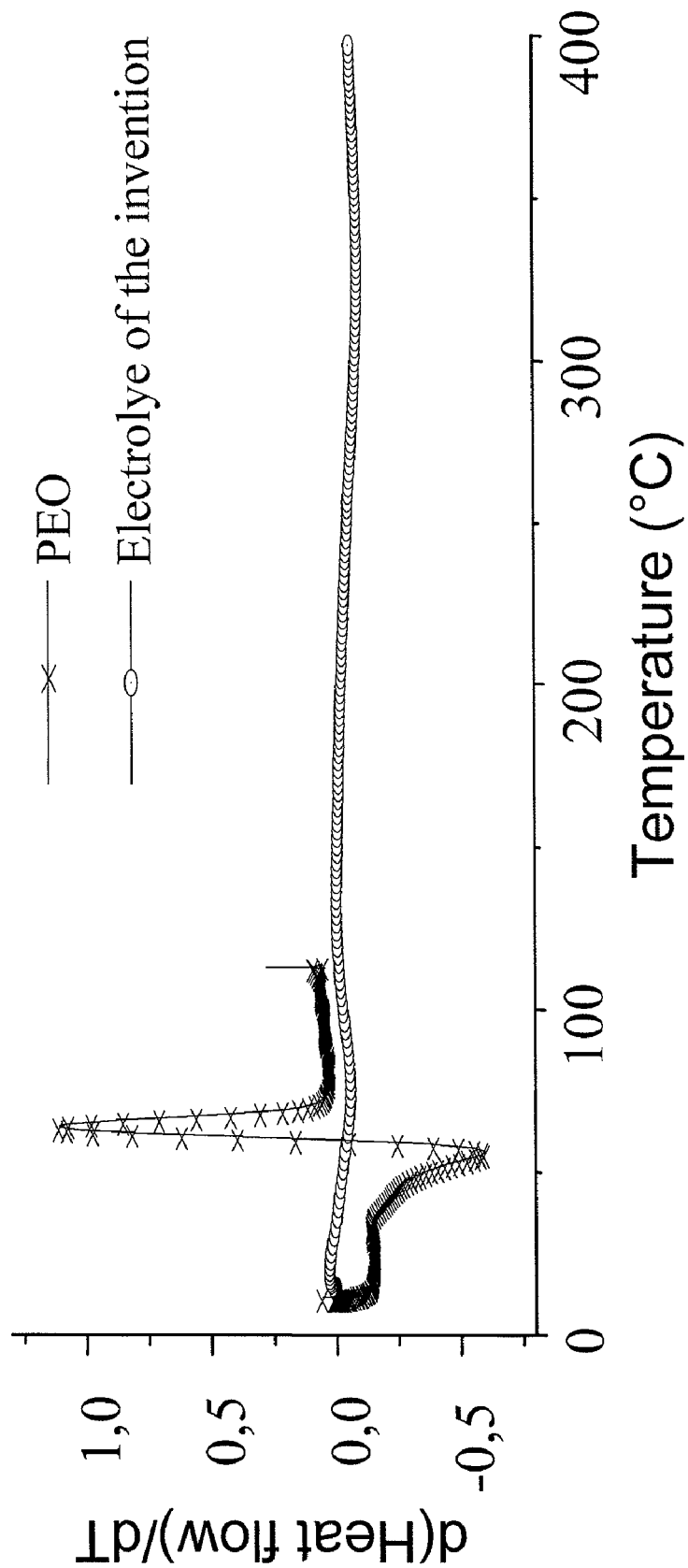
FIG. 2 represents the differential scanning calorimetry curves for a conventional polymer electrolyte and for a glassy organic electrolyte according to the invention.

FIG. 2 represents the curves obtained as a function of temperature.

As can be seen in FIG. 2, the differential scanning calorimetry curve of the polyethylene oxide had a clearly defined glass transition peak at a temperature of 60° C. whereas no notable change was observed with the solid electrolyte of the invention.

In this sense, the lithiated glassy organic electrolytes of the invention make it possible to solve the problem of thermal stability of the solid electrolyte.

Example 3

Demonstrating the Influence of the Amount of Crosslinking of the Electrolyte According to the Invention on its Conductivity A solid electrolyte having the same formula as the solid electrolyte from Example 1 was prepared in the same manner as in Example 1, except the plasma power, which was 300 W for 20 minutes, led to an electrolyte being obtained that had a hardness of 20 GPa.

An impedance spectroscopy measurement was then carried out on the solid electrolyte obtained from Example 1 and on the solid electrolyte obtained in this Example 3.

Figure 3:
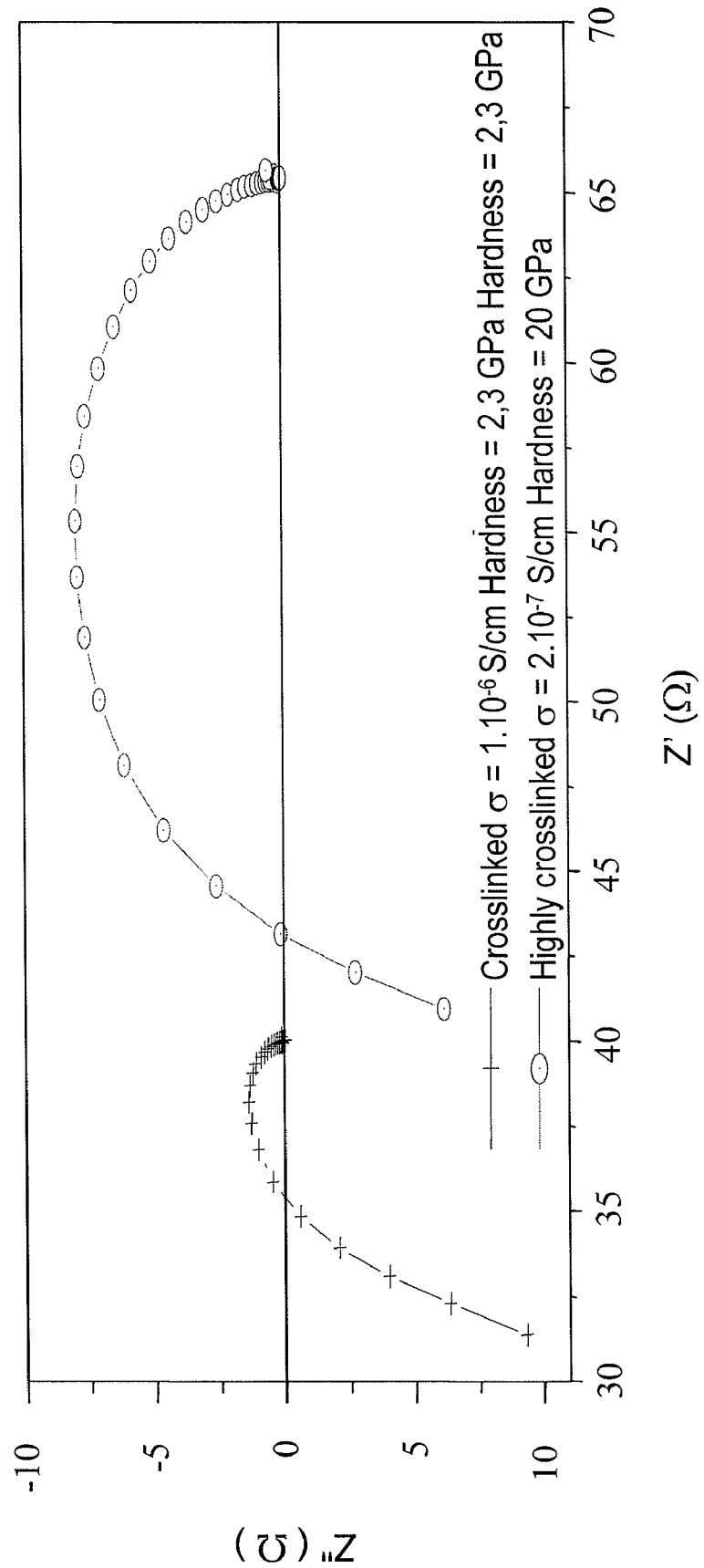
FIG. 3 represents the impedance spectroscopy measurements carried out on the glassy organic electrolytes of the invention respectively having a hardness of 2.3 GPa and 20 GPa.

FIG. 3 represents the impedance curves obtained.

As can be seen in FIG. 3, the ionic conductivity associated with the electrolyte obtained in Example 1 was $3 \times 10^{-6}$ S/cm whereas this ionic conductivity drops to $2 \times 10^{-7}$ S/cm with the electrolyte obtained in this Example 3.

Thus, the hardness of the electrolyte of the invention must be kept between 0.5 and 20 GPa inclusive.

Example 4

Manufacture of a Planar Microbattery

Figure 4:
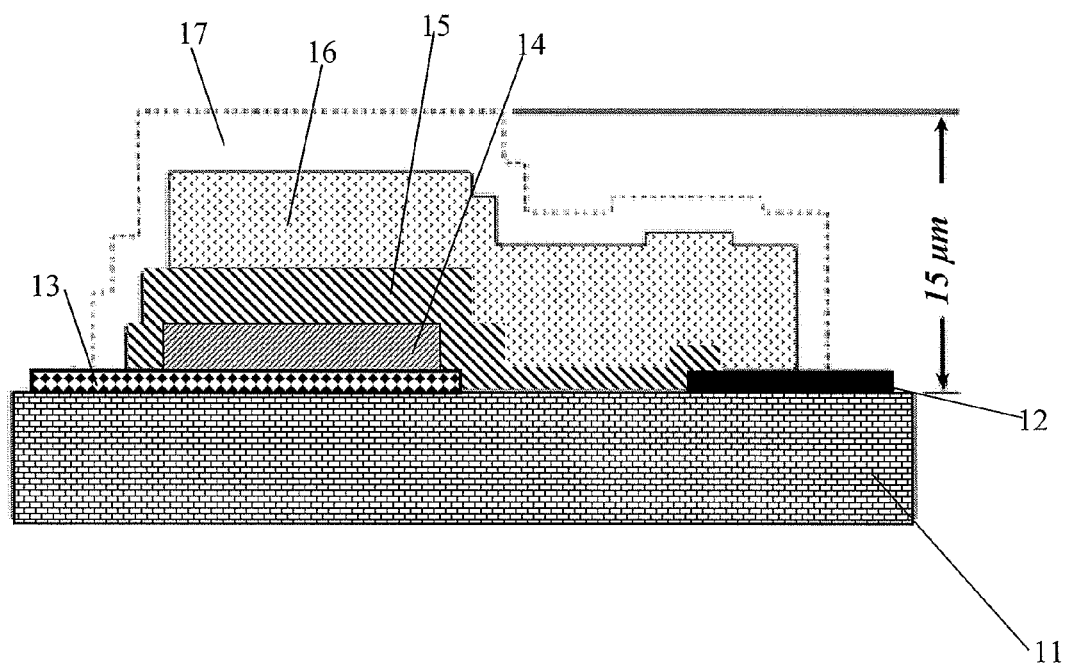
FIG. 4 schematically represents a cross-sectional view of a planar lithium microbattery comprising an electrolyte of the invention.

An example of a planar microbattery is shown schematically in FIG. 4.

As can be seen in FIG. 4, the planar microbattery is composed of the successive stacking of the following layers:
  a silicon substrate denoted by 11 in FIG. 4;
  a gold anode current collector denoted by 12 in FIG. 4;
  a gold cathode current collector denoted by 13 in FIG. 4;
  a vanadium oxide ($V_2O_5$) cathode denoted by 14 in FIG. 4;
  a solid electrolyte according to the invention, denoted by 15 in FIG. 4;
  a lithium anode, denoted by 16 in FIG. 4; and
  a parylene encapsulation layer, denoted by 17 in FIG. 4.

In order to produce this planar microbattery, the silicon substrate 11, equipped with its two gold current collectors (12, 13) was coated with the $V_2O_5$ layer, forming the cathode, by a process known in the art such as DC or RF sputtering starting from a vanadium or $V_2O_5$ target in the presence of oxygen.

The electrolyte was then deposited by the technique described in Example 1 above. Next, the anode was deposited by evaporation under vacuum of a lithium source.

Finally, the assembly was encapsulated in poly(para)xylene or parylene.

Example 5

Manufacture of a Three-Dimensional Microbattery

The three-dimensional structure of the microbattery made it possible to increase the active storage area while retaining an identical apparent area. The use of the solid electrolyte of the invention was particularly suitable in this type of structure which requires the constituent materials of the microbattery to be deposited in a conformal manner.

Figure 5:
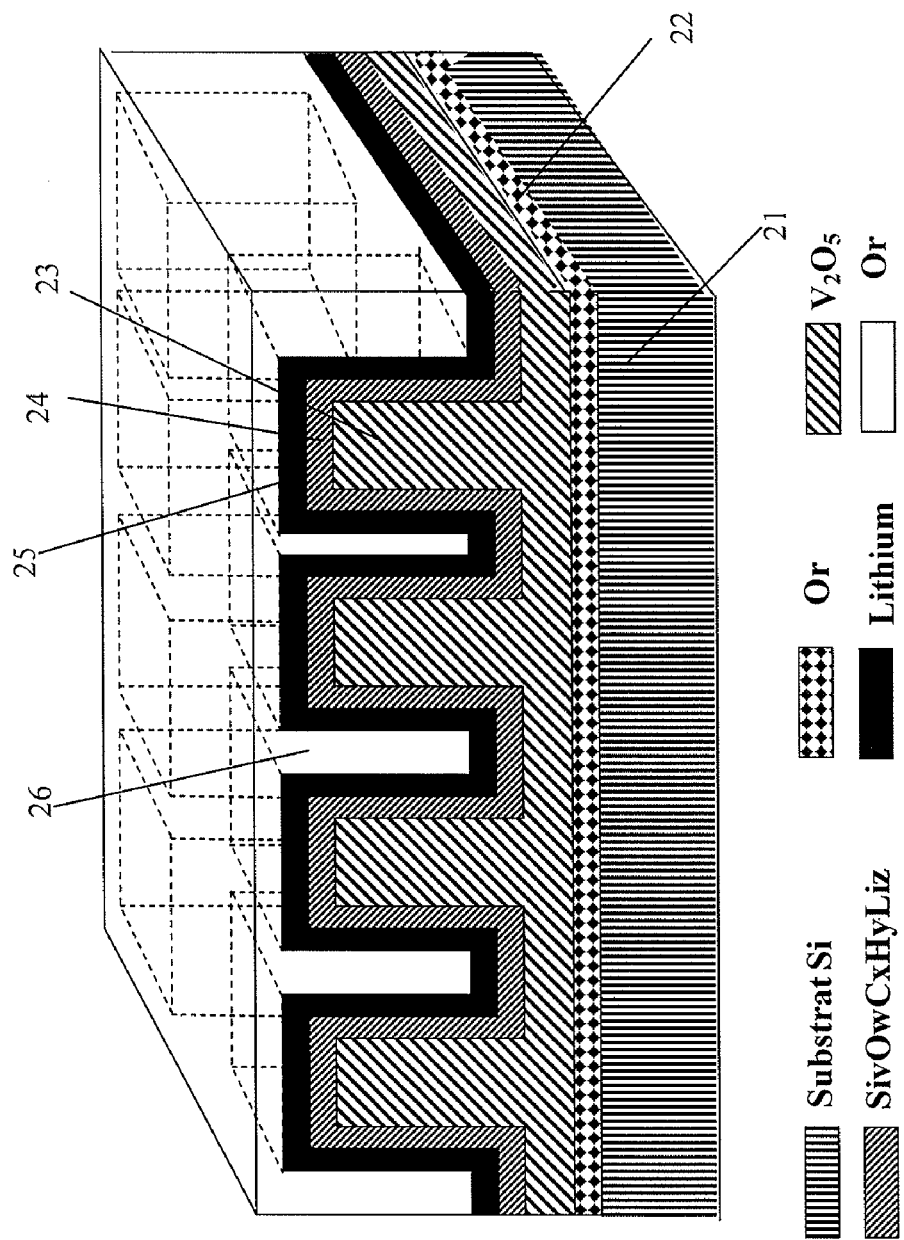
FIG. 5 is a schematic representation of a lithium microbattery having a three-dimensional structure comprising a layer of electrolyte according to the invention.

FIG. 5 is a schematic representation of a microbattery with a three-dimensional structure.

As can be seen in FIG. 5, the microbattery with a three-dimensional structure is composed of a silicon substrate, denoted by 21 in FIG. 5, coated with a layer of a gold cathode current collector material, denoted by 22 in FIG. 5.

A layer, denoted by 23 in FIG. 5, made of vanadium oxide $V_2O_5$, which was the cathode, was deposited on layer 22. This vanadium oxide layer 23 was deposited over a three-dimensional pattern by a process known in the art, such as DC or RF sputtering starting from a vanadium or $V_2O_5$ target in the present of oxygen. This layer 23 was then textured by photolithographic techniques.

A layer, denoted by 24 in FIG. 5, of an electrolyte according to the invention was then deposited by the technique described in Example 1 so as to follow the three-dimensional pattern of the cathode layer 23.

Next, an anode layer made of lithium, denoted by 25 in FIG. 5, was deposited on layer 24 of the solid electrolyte of the invention by evaporation under vacuum of a lithium source.

Finally, a gold anode current collector layer, denoted by 26 in FIG. 5, was deposited onto the anode while still respecting the three-dimensional pattern obtained due to the texturization via photolithography of the $V_2O_5$ cathode layer 23.

Example 6

Production of an Electrochromic System

The electrolytes based on organic glass of the invention may also be used in electrochromic systems.

In this type of system, the application of a voltage makes it possible to insert or de-insert a cation (for example, a lithium cation) into or from a material whose colour changes with the oxidation state. This material is in contact with an electrolyte which provides the cation source.

The device produced with the solid electrolyte of the invention was obtained, for example, by the successive stacking of the following layers:
  a glass substrate;
  an indium tin oxide (ITO) current collector obtained by DC sputtering;
  a $WO_3$ cathodic electrochromic material obtained by DC sputtering under an argon+oxygen atmosphere, followed by annealing;
  an electrolyte material according to the invention;
  a $ZrO_2$ anodic electrochromic material obtained by DC sputtering;
  an ITO current collector obtained by DC sputtering; and
  a transparent parylene encapsulation.

The invention claimed is:

1. Electrolyte characterized in that it is an amorphous solid of formula I below:

$$Si_vO_wC_xH_yLi_z \qquad \text{formula I}$$

in which v, w, x, y and z are atomic percentages with
  $0 \leq v \leq 40$;
  $5 \leq w \leq 50$;
  $x > 12$;
  $10 \leq y \leq 40$;
  $1 \leq z \leq 70$; and
  $95\% \leq v+w+x+y+z \leq 100\%$.

2. Electrolyte according to claim 1, characterized in that, in the formula I:

$0 \leq v \leq 15$;
$15 \leq w \leq 30$;
$20 \leq x \leq 40$;
$15 \leq y \leq 30$; and
$20 \leq z \leq 40$.

3. Electrolyte according to claim 1, characterized in that it additionally comprises at most 5 at % of at least one dopant element.

4. Electrolyte according to claim 3, characterized in that said at least one dopant element is chosen from the group consisting of fluorine, boron, phosphorus, nitrogen or mixtures thereof.

5. A completely solid microbattery comprising an electrolyte according to claim 1.

6. An electrochromic system comprising an electrolyte according to claim 1.

7. A lithium battery comprising an electrolyte according to claim 1.

* * * * *

UNITED STATES PATENT AND TRADEMARK OFFICE
CERTIFICATE OF CORRECTION

PATENT NO. : 8,153,305 B2
APPLICATION NO. : 12/116585
DATED : April 10, 2012
INVENTOR(S) : Martin et al.

It is certified that error appears in the above-identified patent and that said Letters Patent is hereby corrected as shown below:

On the Title page,
Item (73), Assignees, should read:
--COMMISSARIAT A L'ENERGIE ATOMIQUE, Paris (FR); STMICROELECTRONICS SA, MONTROUGE (FR)--.

Signed and Sealed this
Sixteenth Day of July, 2013

Teresa Stanek Rea
*Acting Director of the United States Patent and Trademark Office*